US009437395B2

(12) United States Patent
Li

(10) Patent No.: US 9,437,395 B2
(45) Date of Patent: Sep. 6, 2016

(54) METHOD AND COMPOUND SYSTEM FOR INSPECTING AND REVIEWING DEFECTS

(71) Applicant: Hermes Microvision Inc., Hsinchu (TW)

(72) Inventor: Shuai Li, Fremont, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 14/964,316

(22) Filed: Dec. 9, 2015

(65) Prior Publication Data

US 2016/0163502 A1    Jun. 9, 2016

Related U.S. Application Data

(60) Provisional application No. 62/089,536, filed on Dec. 9, 2014.

(51) Int. Cl.
*H01J 37/22* (2006.01)
*H01J 37/285* (2006.01)
*H01J 37/28* (2006.01)
*H01J 37/05* (2006.01)

(52) U.S. Cl.
CPC .............. *H01J 37/222* (2013.01); *H01J 37/05* (2013.01); *H01J 37/28* (2013.01); *H01J 37/285* (2013.01)

(58) Field of Classification Search
USPC .............................. 250/306, 307, 310, 396 R
See application file for complete search history.

(56) References Cited

U.S. PATENT DOCUMENTS

| 6,392,231 B1 | 5/2002 | Chen |
| 6,583,413 B1 * | 6/2003 | Shinada ............... G01N 23/225 250/306 |
| 6,841,776 B1 | 1/2005 | Adler |
| 7,504,626 B2 | 3/2009 | Tachibana et al. |
| 7,705,301 B2 | 4/2010 | Tseng et al. |
| 7,759,653 B2 | 7/2010 | Chen et al. |
| 7,875,849 B2 | 1/2011 | Fukuda et al. |
| 7,893,406 B1 | 2/2011 | Zhang et al. |
| 7,960,697 B2 | 6/2011 | Chen et al. |
| 8,164,060 B2 | 4/2012 | Liu et al. |
| 2009/0090866 A1 | 4/2009 | Zhang et al. |

OTHER PUBLICATIONS

Tian-TongTang, "Aberration analysis of crossed-field analyzer", Optik 1986, pp. 51-56, Xi'an Jiaotong University Xi'an, China.

(Continued)

*Primary Examiner* — Kiet T Nguyen
(74) *Attorney, Agent, or Firm* — WPAT, PC; Justin King

(57) ABSTRACT

The present invention provides an improved electron-optical apparatus for the inspection and review of the specimen, and for the defect inspection, an inspection mode of operation is performed to generate inspection data, wherein the large beam current is formed by a magnetic immersion lens to scan the specimen, and preferably the objective lens system, a swing objective retarding immersion lens, focuses the beam current and generates the large scanning field, and for the defect review, the review mode of operation is performed to analyze the defects, wherein the large beam current is abandoned and the small beam current is adopted to examine the specimen without a large scanning field, and in order to properly select and detect signal charged particles excited from the specimen, a first Wien filter is utilized to select the acquired signal particles and a second Wien filter is used to compensate the aberrations induced when the signal particles pass through the first Wien filter.

21 Claims, 9 Drawing Sheets

(56) References Cited

OTHER PUBLICATIONS

S. Beck, E. Plies, B. Schiebel, "Low-voltage probe forming columns for electrons", Nuclear instrument & methods in physics research A 363, (1995), 31-42, Germany.

M. Kienle, E. Plies, "An off-axis multi-channel analyzer for secondary electrons", Nuclear instrument & methods in physics research A 519, (2004), 325-330, Germany.

X.D. Liu, T. T. Tang, "Aberration analysis of Wien filters and design of an electron energy-selective imaging system" Nuclear instrument & methods in physics research A 363, (1995), 254-260, China.

* cited by examiner

METHOD AND COMPOUND SYSTEM FOR INSPECTING AND REVIEWING DEFECTS

BACKGROUND OF THE INVENTION

The invention relates to an electron optical inspection apparatus for sample inspection and defect review in semiconductor manufacturing and the like. However, it would be recognized that the invention has a much broader range of applicability.

All the way through, during the fabrication processes of semiconductor devices such as integrated circuits (ICs) and memory devices, the defects inevitably existed on the wafer, even on the reticle or mask, keep impacting the yield of products, and thus the measure regarding to the detection of defects is supremely demanded. Prior to the sub-micron age, the optical inspection tools were the significant means to detect the defects on the wafer. However, with the narrowing dimension of the semiconductor devices, the conventional optical inspection tool was thrown into a dilemma for the dimension of defects became smaller than its optical wavelength to probe defects. On the other hand, with the progress of the semiconductor fabrication, the multi-layer architecture is built on the semiconductor wafer, in which insulating layers and interconnects are between interconnect layers. In such a manner, some kind of new types of defects, such as lower defects appeared in the interconnect layers and interconnects, occur and are impossible to be observed by the optical inspection tools. For example, in the dual damascene process, Via etching and Cu filling cause the killer defects like etching residual defects, voids, voltage-contrast type defects (e.g. electrical shorts or open at contacts), etc. which make us require a different means from the optical inspection tool to find them for their hiding places inside the damascene structure. Therefore, the e-beam inspection tools turn out to be the only means in response to the prompt demand on the less than submicron defects and the new type defects for their unique characteristics.

In the technical aspect, the e-beam inspection applies the beam current to probe the select part of wafer and detects signal electrons (e.g. secondary electrons, back scatter electrons and Auger electrons) from it so that the image is collected. And for the optical inspection tools, it is the measurement of light reflected from the surface of sample. Between them, the throughput gap is the mainly distinction, and in addition, it can also see why the optical inspection can only detect defects on the surface for the reflected light being from the sample surface. To fill the gap, the industry has been working on the e-beam inspection tools with the large field and large beam, further, on the multi-beam inspection tools. However, the e-beam inspection tool with the large field and large beam has a disadvantage that the off-axis aberrations are large and the resolution refers to be lower which leads to finely analyze defects being limited. Consequently, in a practical way, two types of e-beam inspection tools were employed for the wafer inspection in turn to improve the throughput. The first used e-beam inspection tool is called the EB inspection for finding the region of interesting (or hot areas), which means the possible areas defects existed, on wafer. The EB inspection is an e-beam inspection tool with both of large field and large beam, and hence it has a faster scanning speed but a lower resolution. It cannot meet the requirement of the high resolution, so what it can do is to mark the region of interesting rather than analyze the defects. The second one is called the EB review (also named Review SEM) for finely analyzing defects based on the image data from the EB inspection instead of scanning the whole wafer to find defects. The small scanning field, the small beam and the high resolution feature the EB review which has a poor throughput. As mentioned above, the examination of wafer defects includes two steps: the first one is "the inspection", that is, the EB inspection is used to help find the region of interesting. The second one is considered as "the review", namely, the EB review is adopted to further analyze defects. In the way, the throughput can be promoted due to at first we approximately make sure the positions of defects, after that do analysis of defects on these positions, which makes reviewing the entire wafer not required.

For the sake of farther saving cost and time, some prior arts have provided e-beam inspection tools including two modes of the inspection and the review (i.e., possessing dual function of the EB inspection and the EB review), in which the specimen can be inspected and reviewed in single inspection tool without two separate inspection tools, so as to get rid of extra stage moving, transfer or relocation. For instance, patents of U.S. Pat. No. 7,960,697, U.S. Pat. No. 7,759,653 and U.S. Pat. No. 8,164,060 have disclosed a type of scanning electron apparatus with inspection and review mode of operation. Taking U.S. Pat. No. 7,759,653 as an example of the configuration, the electron beam apparatus comprises a cathode 101, an anode 102, a condenser lens 103, an immersion objective lens 104, an in-lens detector 105 and a single deflector system 106 containing two deflectors for a large scanning field such as shown in FIG. 1. In these patents, the inspection mode and the review mode could be switched by selecting the different working mode of objective lens 104 and in-lens detectors 105 (i.e., their optimum condition for inspection mode and review mode of operation, respectively). Noted that whether the inspection mode or the review mode has no choice but to operate in a large scanning filed because the single one deflector system 106 for a large scanning filed is equipped with. However, it has a fatal flaw that an enlarged spot size is produced on the specimen while operating in the review mode acquired high resolution, because the deflector system 106 for a large scanning field is equipped with the high deflective sensitivity so that the noise from the deflector's driver (not depicted) strongly impacts the stability of the primary electron beam deflected. Besides, the single condenser lens 103 in these apparatus would make a limitation to select the size of the electron beam. In U.S. Pat. No. 6,841,776 disclosed by KLA-Tencor Technologies Corporation, as depicted in FIG. 2, it descripted an electro-optical apparatus with two subsystems for inspecting and reviewing, herein the inspection subsystem is performed while the substrate is on a continuously moving stage 205. The two subsystems share all electron optical elements in common, for example a cathode 210, a gun aperture 202, a beam aperture 203, an objective lens 204, a stage 205 and a detector system 206, etc., which makes it also hit the problem of satisfying the different demand of operating them.

Due to these problems, there is a need for a more reliable and accurate electron optical apparatus with two modes of operation which allows the two subsystems can functionally execute well, respectively, without the limits of the functional compatibility between the inspection mode of operation and the review mode of operation.

SUMMARY OF THE INVENTION

The above objects are met by an improvement to the electron optical inspection tool with both the inspection subsystem and the review subsystem for the examination of the specimen. The present invention proposes an optimum construction for the tool, which can be used with any charged particles inspection tool including but not limited to a scanning electron microscope (SEM). The optimum construction of the inspection subsystem mainly comprises the immersion condenser lens and the swing objective lens producing a large scanning field, and of the review subsystem does the non-immersion condenser lens and the objective lens generating a small scanning field. The present invention resolves the problems of cost saving, time consuming and functional conflict between the two working modes while sharing the same apparatus.

One embodiment relates to a charged particle beam apparatus comprises a charged particle source for generating a beam current, an immersion condenser lens for an inspection mode of operation, a non-immersion condenser lens below the charged particle source for a review mode of operation, an objective lens for focusing the beam current onto a specimen and a first electron optical element in the objective lens to deflect signal charged particles emanated from the specimen and a second electron optical element to compensate aberrations generated when the signal charged particles pass through the first electron optical element and a detector system with multi-channels for detecting the signal charged particles. The charged particle beam apparatus of claim 1, wherein the immersion condenser lens is turned on in the inspection mode of operation and the immersion condenser lens is turned off in the review mode of operation.

In one embodiment, the charged particle beam apparatus further comprising a first beam aperture for the inspection mode of operation is disposed closed to the charged particle source, a second beam aperture for the review mode of operation is disposed below the non-immersion condenser lens and the charged particle beam apparatus further comprises a scanning deflection coil.

In another embodiment, the first electron optical element with an electromagnetic multi-pole is below the detector system and makes a dipole field to select the signal charged particles for the inspection mode of operation and a quadrupole field to select the signal charged particles with different emission azimuth angles for the review mode of operation. Furthermore, the second electron optical element with an electromagnetic multi-pole is above the detector system and makes a dipole or quadrupole field to compensate the aberrations. The charged particle beam apparatus of claim 1, wherein the first and second electron optical elements are Wien filters or ExB filters.

In one embodiment, an apparatus for inspection and/or review of a specimen comprises a charged particle source for generating a beam current, a magnetic immersion condenser lens, a magnetic non-immersion condenser lens, and an objective lens system, comprises a compound objective lens, a first deflection system for deflecting and positioning the beam current on the specimen, a second deflection system for deflecting the beam current to scan the specimen and a detector with at least one channel to detect signal charged particles emanated from the specimen, wherein the inspection of the specimen is performed while the magnetic immersion condenser lens is turned on, and the review of the specimen is performed while the magnetic immersion condenser lens and the first deflection system are turned off.

In another embodiment, the apparatus for inspection and/or review of a specimen further comprising a first beam aperture for the inspection mode of operation is disposed closed to the charged particle source. Furthermore, the apparatus for inspection and/or comprises a second beam aperture for the review mode of operation is disposed below the non-immersion condenser lens.

In another embodiment, the apparatus for inspection and/or review of a specimen, the compound objective lens, the first and second deflection systems form a swing objective retarding immersion lens and the first deflection system comprises a plurality of deflectors arranged within the compound objective lens and along an optical axis, at least one of the deflectors is located in a retarding field of a retardation electrode for generating a swing objective lens axis, and the second deflection system comprises a plurality of defectors arranged along the optical axis.

In another embodiment, the apparatus for inspection and/or review of a specimen further comprises a first Wien filter is below the detector and makes a dipole field to select the signal charged particles for the inspection mode of operation and a quadrupole field to select the signal charged particles with different emission azimuth angles for the review mode of operation. Furthermore, the apparatus for inspection and/or review of a specimen further comprises the second Wien filter is above the detector system and makes a dipole or quadrupole field to compensate aberrations generated when the signal charged particles pass through the first Wien filter.

In another embodiment, the apparatus for inspection and/or review of a specimen the compound objective lens comprises an immersion magnetic lens and an electrostatic lens for focusing the beam current. Furthermore, the first deflection system has a large scanning deflective sensitivity for a large scanning field and the second deflection system has a small scanning deflective sensitivity for a small scanning field. In another embodiment, the first deflection system is turned off and grounded for the review of the specimen and the second deflection system is turned off and grounded while the first deflection system is performing for the inspection of the specimen.

In one embodiment, a method for inspection and review of a specimen comprises inspecting the specimen in an apparatus to position defect locations and reviewing the defect locations, wherein the inspecting is performed in an inspection mode of operation while a magnetic immersion condenser lens is turned on, and the reviewing is performed in a review mode of operation while a magnetic immersion condenser lens and a first deflection system are turned off.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Some of the above indicated and the detailed of the present invention will be described in the following description accompanying with the figures, and therein.

DETAIL DESCRIPTION OF THE INVENTION

Embodiments of an electron optical tool with two working modes in accordance with the present invention will now be made in detail and illustrated in accompanying drawings. It will be understood that it is not intended to limit the invention to these embodiments. On the contrary, it is intended to cover alternatives, modifications, and equivalents as may be included within the spirit and scope of the invention as defined by the claims.

Figure 1:
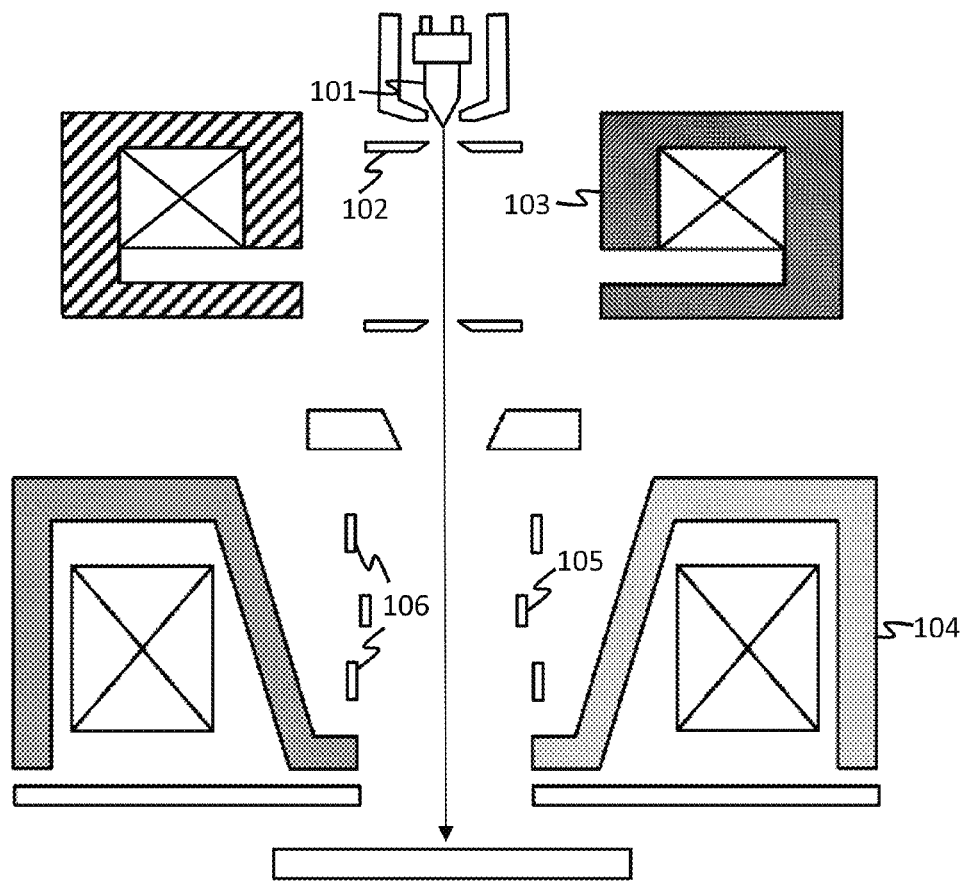
FIG. 1 is a schematic diagram of a prior art apparatus with inspection and review modes of operation.
Figure 2:
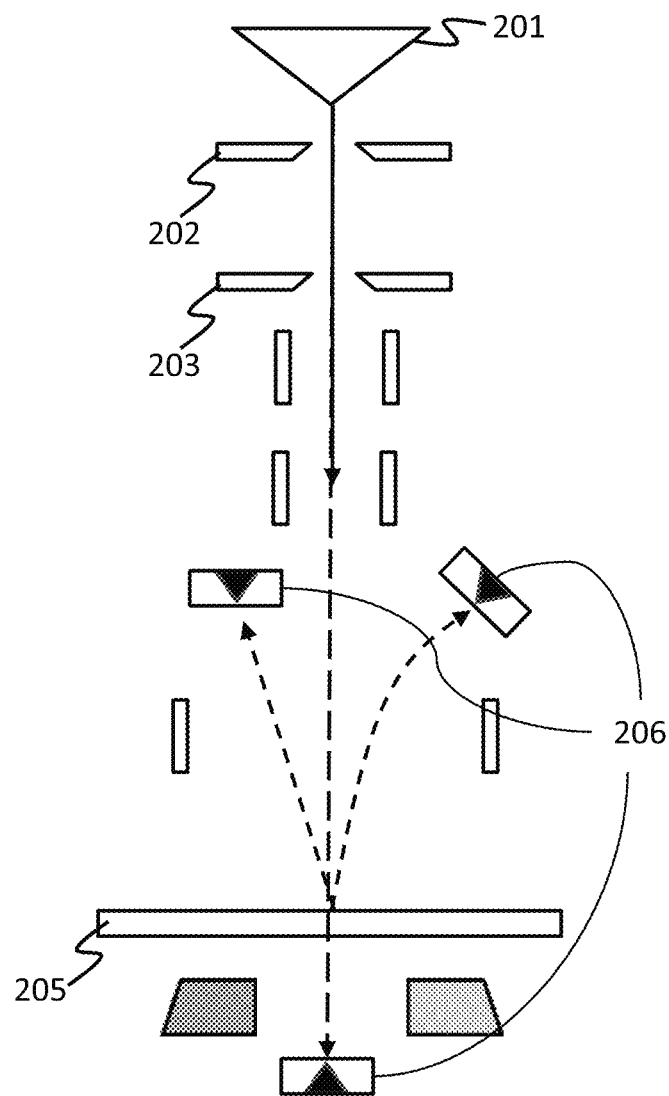
FIG. 2 is a schematic diagrammatic representation of a prior art apparatus with inspection and review modes of operation.
Figure 3A:
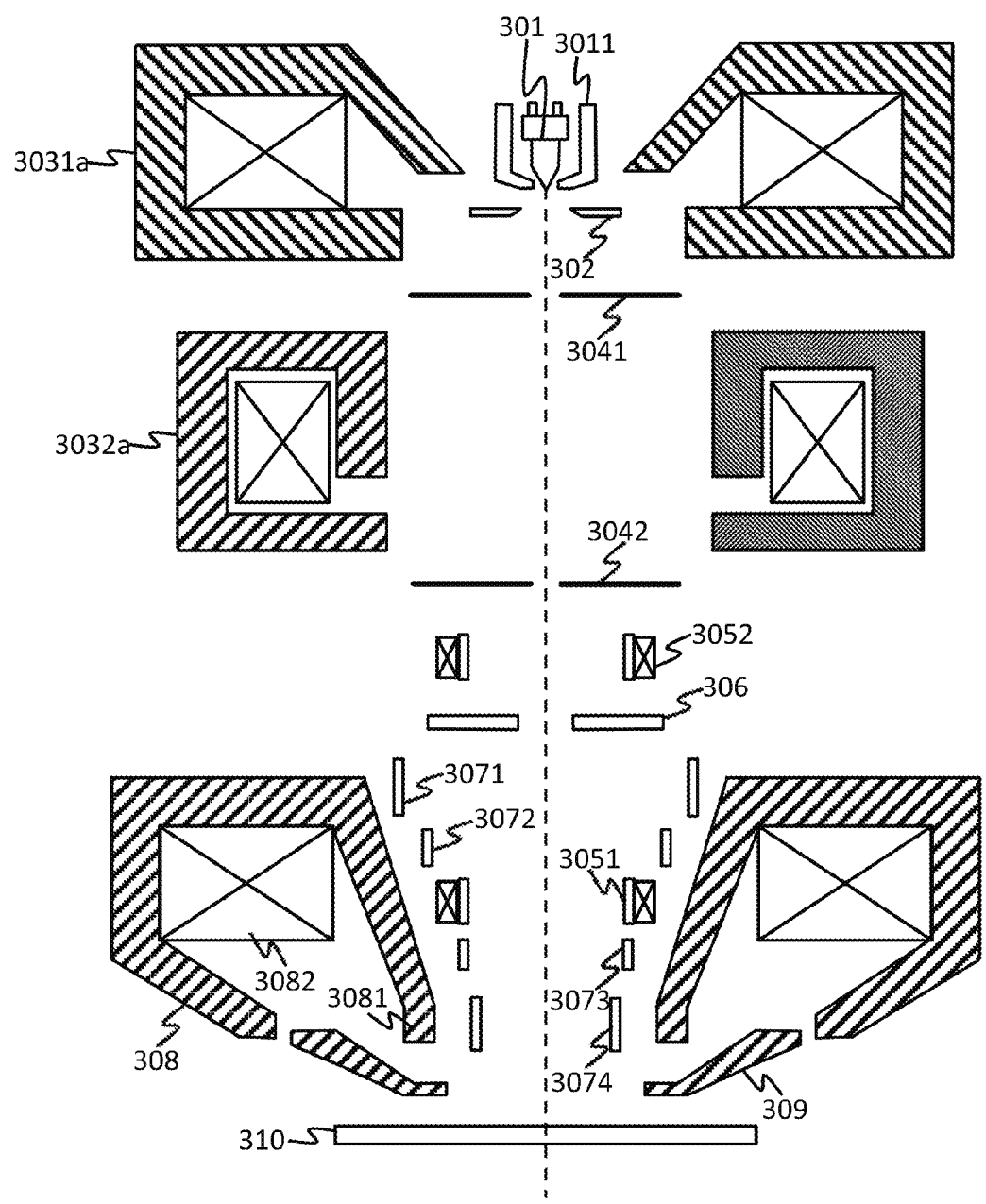
FIGS. 3(a) and (d) are schematic diagrammatic representations of an apparatus with inspection and review modes of operation of the first embodiment and of another embodiment for the present invention, respectively.

A first preferred embodiment according to the present invention is shown schematically in FIG. 3(a). An electro-optical system, preferably a SEM, has two working modes for observing defects on the wafer, one of which acts as an inspection mode and the other as a review mode. The components of the system comprise: a cathode 301, a suppression electrode 3011, an accelerated anode 302, a first condenser lens 3031a arranged rotational symmetry about the optical axis and surrounded the cathode 301, a first beam aperture 3041 beneath the accelerated anode 302, a second condenser lens 3032a, a second beam aperture 3042, a second Wien filter 3052 above a detector 306, an objective lens system below the detector 306, and a stage (not shown). Therein, the first and second condenser lens (3031a and 3032a) each is constituted of an excitation coil and a yoke to generate a magnetic field. The objective lens system includes a magnetic objective lens 308 having an inner pole piece 3081 and a excitation coil 3082, two in-lens deflector systems which both are positioned within the magnetic objective lens 308 to achieve a short working distance for gaining a better resolution contain a first group of a No. 1 deflector 3071 and a No. 4 deflector 3074 and a second group of a No. 2 deflector 3072 and a No. 3 deflector 3073, a controlling electrode (retardation electrode) 309 underneath the magnetic objective lens 308, and a specimen 310. Therein the inner pole piece 3081, the retardation electrode 309 and the specimen 310 commonly form an electrostatic lens based on their voltage differences, and which combines with the magnetic objective lens 308 to produce a compound objective lens to focus the beam current from the cathode 301. And a first Wien filter 3051 is arranged between the No. 2 deflector 3072 and No. 3 deflector 3073.

In operation of the inspection mode which features a large beam current and a large scanning field, the inspection of defects with high speed are performed. In the inspection subsystem, a cathode 301 is immersed in a magnetic field from a first condenser lens 3031a to attain the large beam current because of the increasing angular current density and an beam current (not shown) emanating from the immersed cathode 301 is accelerated by an anode 302 and maintains a high energy (8 to 15 KeV) until approaching to the specimen 310 laid on the stage. Also, the immersion lens 3031a is easily to make the large beam current obtain a small geometrical magnification. Then, the beam current passes through a first beam aperture 3041 and is early trimmed down to prevent the spread of Coulomb effect, and now the second beam aperture is moved away. It is noted that, operating in the inspection mode, the second condenser lens 3032a can be turned off or turned on.

Figure 3B:
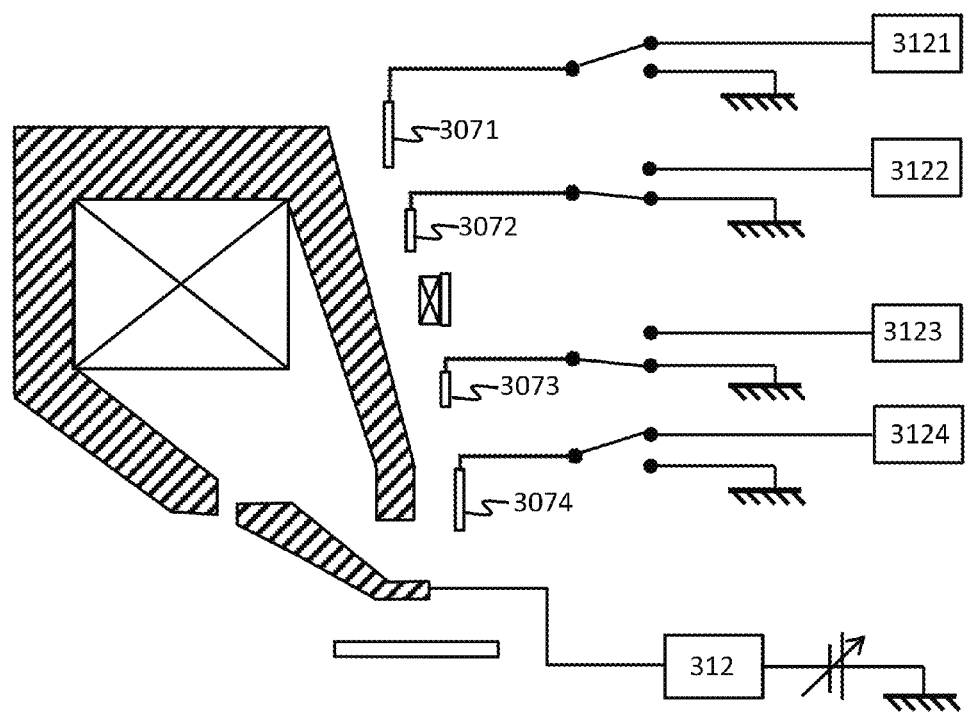
FIGS. 3(b) and (c) are schematic diagrammatic representations of the deflection systems of operation in the inspection and review modes of the first embodiment, respectively.

The first group of deflectors, preferably including 8-pole or 12-pole electrodes, owns the high deflection sensitivity. Therein the No. 4 deflector 3074 generates a field which partially overlaps with a generated field from the magnetic objective lens 308 so that a swinging axis objective lens is taken shape (referring to U.S. Pat. No. 6,392,231). Thereby the off-axis aberrations can be reduced, and the No. 1 deflector 3071 is utilized to decide the incidence direction of primary beam current into the magnetic objective lens 308. The high deflection sensitivity herein represents the deflector can be driven easily by a small voltage. In practical, a deflector's driver usually supplies a constant voltage, and with the condition that the high deflection sensitivity is critical to generate a large scanning field (referring to U.S. Pat. Nos. 7,759,653, 7,960,697 and 8,164,060). As depicted in FIG. 3(b), when the electron beam passes through the objective lens system, firstly the spot formed on the specimen is positioned by the first group of No. 1 deflector 3071 and the No. 4 deflector 3074 which are respectively supplied voltage by drivers 3121 and 3124, meanwhile, the second group of No. 2 deflector 3072 and the No. 3 deflector 3073 are switched-off and grounded, so as to keep the spot away from the generated noise of the second group deflectors' drivers 3121 and 3123. After that, the second group of No. 2 deflector 3072 and the No. 3 deflector 3073, which has the shorter length than that of the first group of deflectors and a low deflection sensitivity, is turned on and starts to scan the specimen on a small scanning field. The low deflection sensitivity results in both of the No. 2 deflector 3072 and the No. 3 deflector 3073 not too sensitive to the change of voltage, which makes an affection of the noise (ex. from deflector's driver) on the spot size dropped to maintain the good resolution. It is noted that the deflective field of No. 2 deflector 3072 and the No. 3 deflector 3073 does not overlap with the field of the magnetic objective lens 308. For the above description, with the benefits of the off-axis aberrations reduced and the high throughput, the large field of view (LFOV) can be practically performed in the inspection subsystem and herein, the objective lens system is known as a Swinging Objective Retarding Immersion Lens (SORIL) (referring to U.S. Pat. No. 6,392,231). Typically, operating at high resolution is commonly conditioned on a restricted field of view (FOV) (1 to 3 deg.), and the SORIL offers a mode that taking advantage of swinging the equivalent objective lens to examine the sample without moving the stage or rotating the SEM column, therefore the examining time is economized and the throughput is improved, meanwhile conserving the high resolution.

Figure 4:
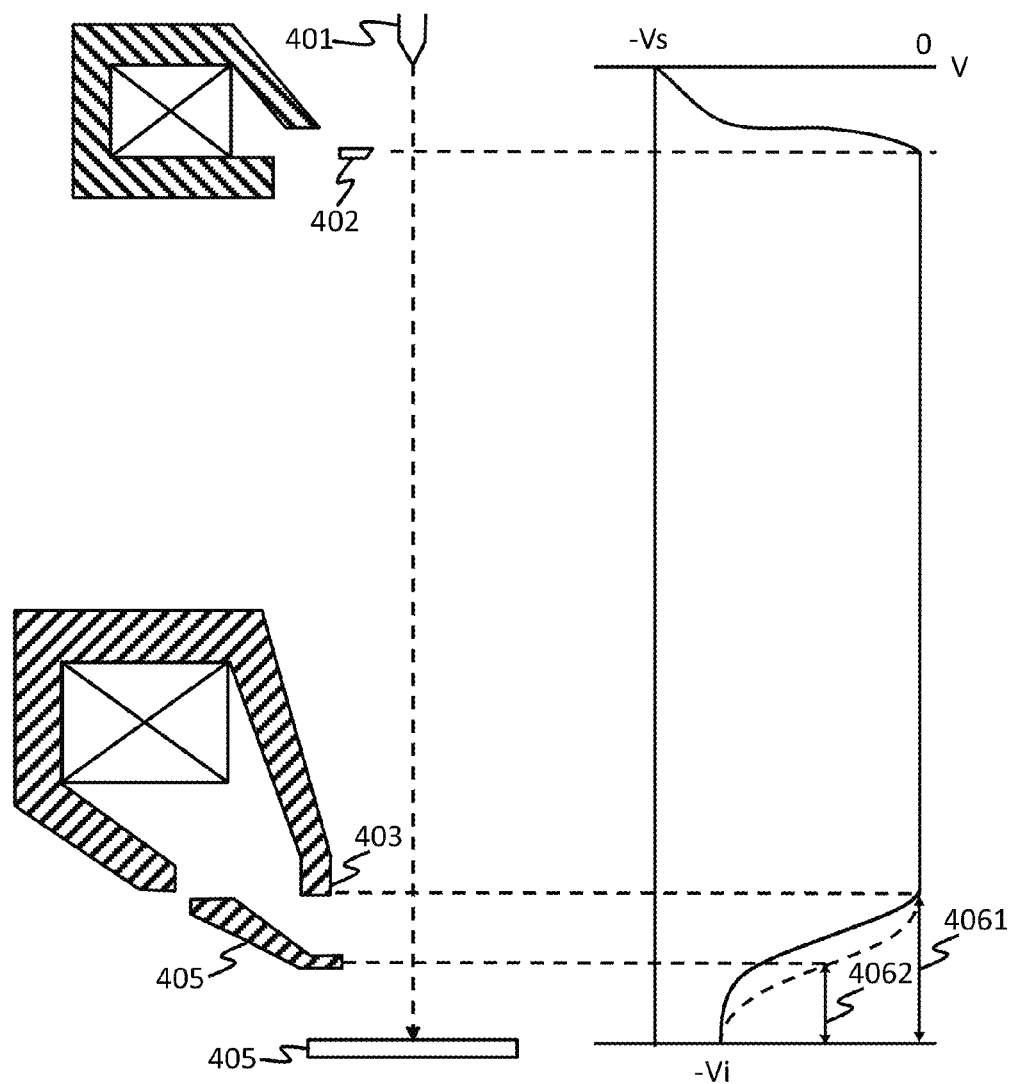
FIG. 4 is a schematic diagrammatic representation of the voltage changing of the beam current and the corresponding focus length to the inspection and review modes of operation of the first embodiment for the present invention.

In the SORIL, i.e., the objective lens system shown in FIG. 3(a), the magnetic objective lens 308 which is a magnetic immersion objective lens generates a magnetic field to immerse the specimen 310, and the electrostatic lens has a dramatic focusing length which can be controlled by adjusting an applied voltage of the controlling electrode 309. In addition, the applied voltage is also used to decelerate the primary beam current in the electrostatic lens for lowering the landing energy to perform the low-energy electron microscope and avoid damaging the specimen 310. Please refer to FIG. 4, the beam current is emitted from the cathode 401 with −Vs KeV voltage, then accelerated to 0 KeV by the accelerated electrode 402 and remained it as passing through the SEM column, and decelerated to −Vi KeV by the retarding electrode 404 before reaching the specimen 405, and eventually it obtains the landing energy (Vs−Vi) KeV. The longer focus length 4061 of the electrostatic lens is acquired while the controlling electrode 404 is supplied a voltage Vc KeV that is approximate to −Vi (adjusted by the driver 312, referred to FIG. 3(b)), thereby the voltage curve of the beam current starts declining form the inner pole piece 403 and finally the beam is focused on the specimen 405, which is suitable for the large scanning field.

After signal electrons (ex. secondary electrons, SE, back scattering electrons, BSE and Auger electrons) are excited and released from the specimen 310, the second Wien filter 3052 works as a deflector to deflect them without altering the orbit of the primary electron beam. And the second Wien filter 3052 makes an aberration compensation for the signal electrons generated by the first Wien filter 3051. The same with the first Wien filter 3051, it also does not influence the primary electron beam. After passing through the first Wien filter 3051, the signal electrons are caught by the detector 306 working as one channel and collected a bright field image.

In operation of the review mode whose character is employing a small beam current and a small scanning field (smaller than several ten μm), the review and analysis of defects at high resolution and multi-view are performed. The review subsystem is the part of the same electro-optical system as the inspection subsystem, in which the cathode 301 is free of the magnetic field attributed to the first condenser lens 3031a be shut down leading to the small beam current. The first beam aperture 3041 is used to trim down the small current as a gun aperture. The second condenser lens 3032a, a non-immersion magnetic lens for the cathode 301, renders a magnetic field to modify the small beam current, and the second beam aperture 3042, which has a lager diameter for resisting contaminants and making its lifetime longer, selects the final beam current hitting the specimen 310.

Figure 3C:
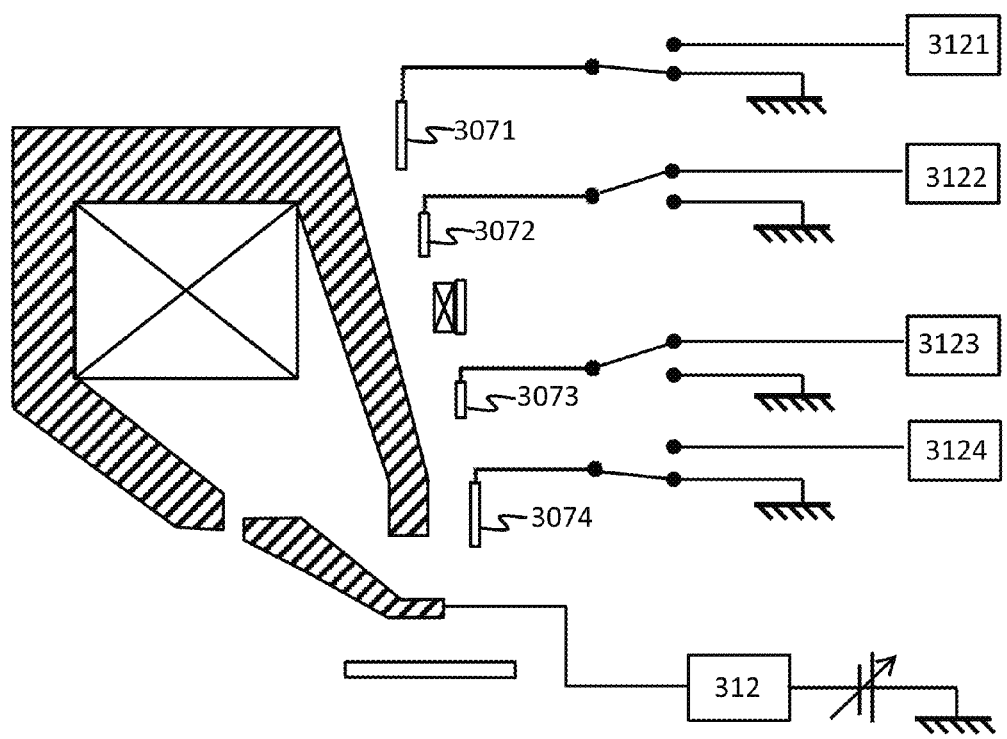

In the objective lens system, the first group of deflectors for the large scanning field is switched off and does not play any part in the review mode, and only the second group of No. 2 deflector 3072 and No. 3 deflector 3073 for the small scanning field acts on the small beam current, therefore, the SORIL fails to be formed in the review mode of operation. In addition, since the first group does not work here, its No. 1 deflector 3071 and No. 4 deflector 3074 are to be turned off and grounded in order to avoid the noise of the drivers 3121 and 3124 of the first group making an interference with the second group of detectors 3072 and 3073 as shown in FIG. 3(c). Also, the second group of deflectors is far away from the field generated by the magnetic objective lens 308 and the electrostatic lens, and its low deflection sensitivity can minimum the driver noise as much as possible. Please refer to FIG. 4 again, the focusing length 4062 of the electrostatic objective lens is relatively short while the voltage Vc KeV applied by the controlling electrode 404 is zero (adjusted by the driver 312, referred to FIG. 3(c)) to gain the high resolution for shorting the range of Coulomb effect.

For the signal electrons from the defects, the detector 306 operated in the review mode severs as multi-channels to collect them, which leads to the image of different side views of the defects obtained (referring to U.S. Pat. No. 7,705,301). In addition, the Wien filters 3051 and 3052 are changed to be the quadruple mode, herein the second Wien filter 3052 compensates the deflection aberrations and the first Wien filter 3051 selects the conditioned signal electrons with different emission azimuth angles to enhance the contrast ratio of the images of the topographic defects without influencing the primary beam current.

It is worth while to note that two Wien filters arranged in the present invention result in a better resolution of the image than the single one does as referred in prior arts, such as U.S. Pat. No. 7,759,653, U.S. Pat. No. 7,705,301 and U.S. Pat. No. 7,960,697, because of their compensation effect. Nevertheless, the controlling electrode 504 is supplied a dynamic voltage by the driver 312 (shown in FIGS. 3(b) and 3(c)) to adjust dynamically and rapidly the focus length to obtain the clear image of the specimen 310 and also compensate the field curve aberration at the non-center spot.

Figure 3D:
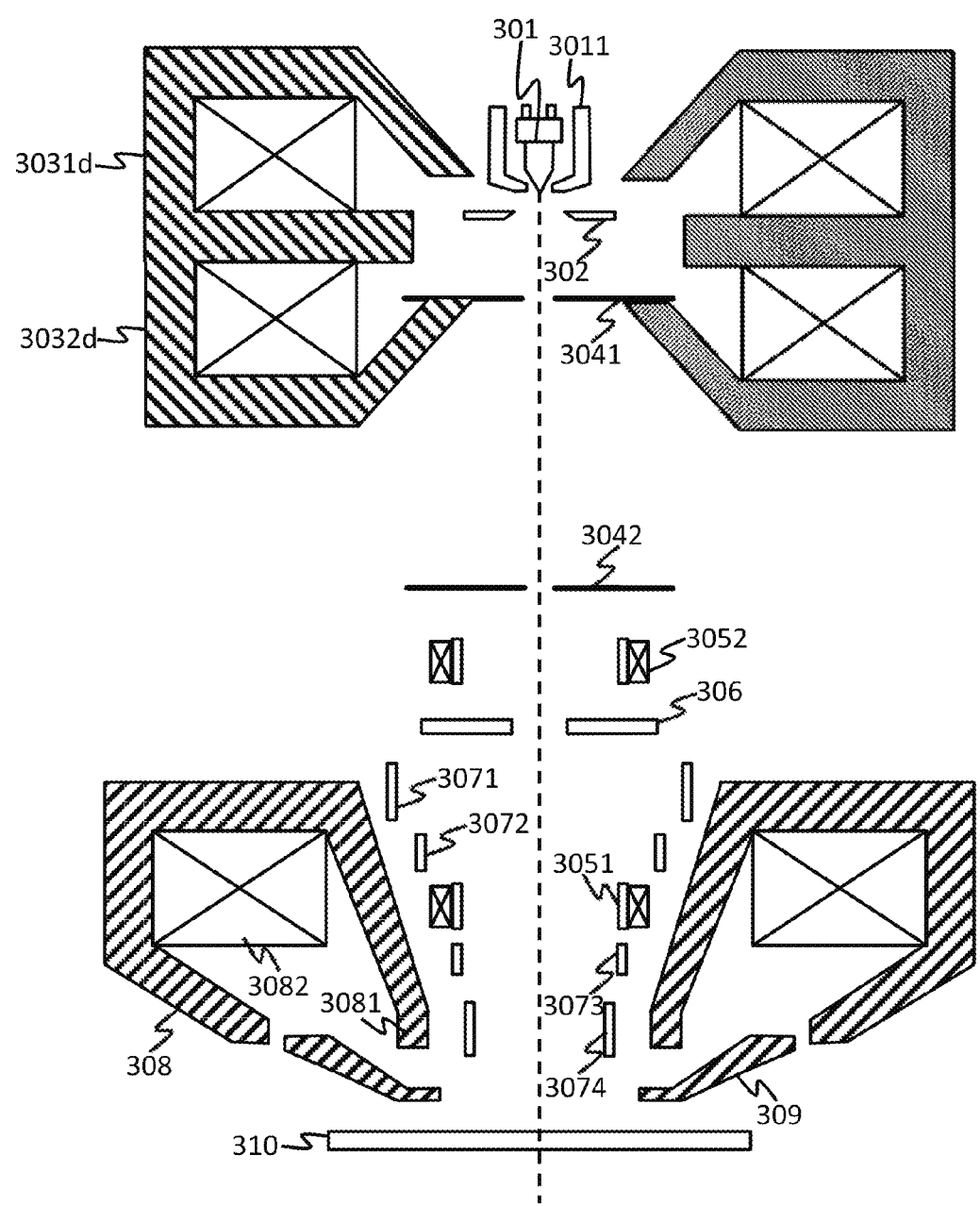

In one embodiment according to the first embodiment in FIG. 3(a), the immersion magnetic lens 3031a and the condenser lens 3032a are altered to a double lens with a magnetic immersion condenser lens 3031d and a magnetic non-immersion condenser lens 3032d following the lens 3031d as shown in FIG. 3(d). While operating in the inspection mode, the magnetic immersion condenser lens 3031d is turned on and on the contrast, the magnetic immersion condenser lens 3031d is turned off and the non-magnetic immersion condenser lens 3032d has to be turned on for the review mode of operation. And the two deflection systems 3071 to 3074 and two Wien filters 3051 and 3052 have the same operation with the embodiment shown in FIG. 3(a). Herein, one aperture can be arranged below the double lens for the preferred beam current.

In another embodiments according to the embodiments in FIGS. 3(a) and (d), a booster (not shown) can be added to each of them, which stretches from the cathode to the SORIL, to accelerate the beam current. Furthermore, the second Wien filter 3052 can be changed to the correction deflector (referring to US20140021366) or just remove it.

Figure 5A:
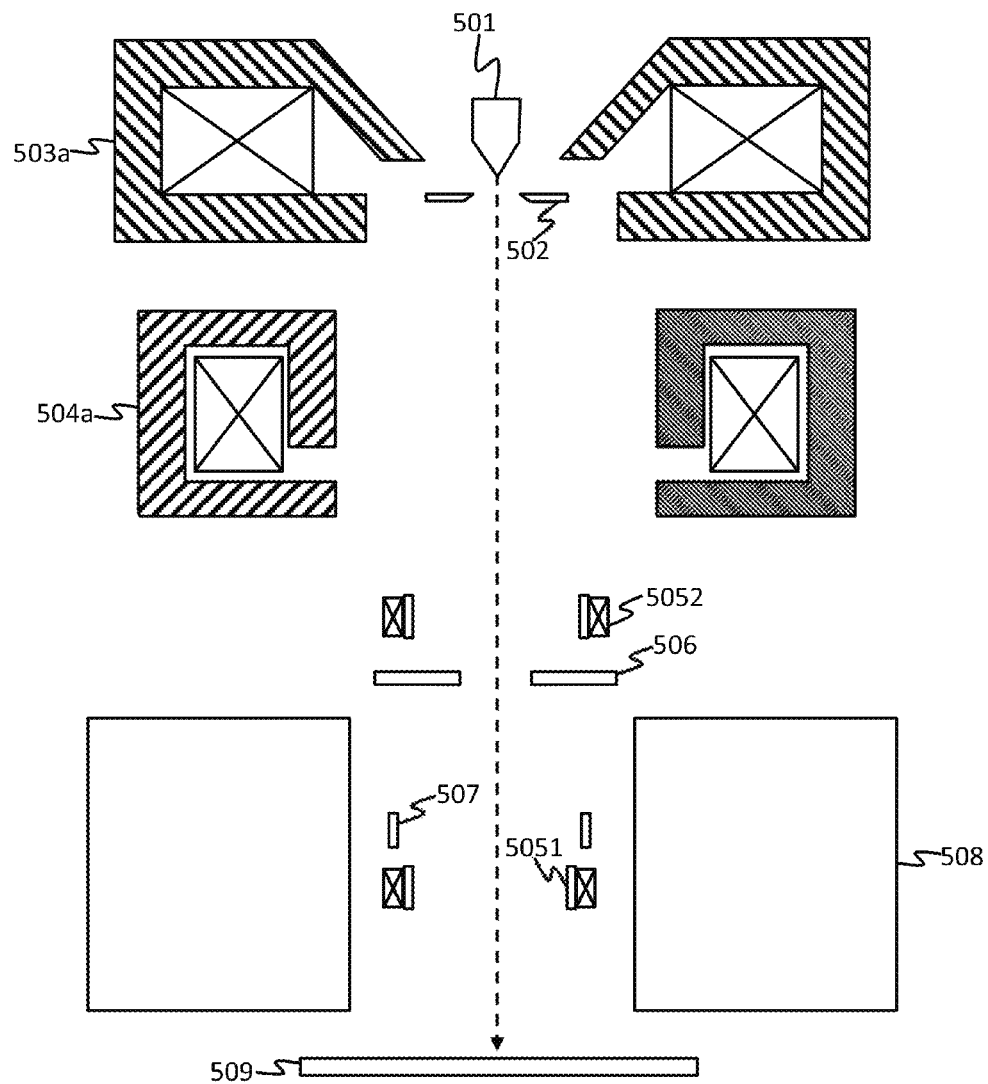
FIGS. 5(a) and (b) are schematic diagrammatic representations of an apparatus with inspection and review modes of operation of the second embodiment and of another embodiment for the present invention, respectively.

FIG. 5(a) shows the fundamental configuration of the present invention in accordance with the second preferred embodiment. It is based on the configuration of the first embodiment in FIG. 3. The objective lens system of the apparatus shown in the first embodiments is comprised of a combination of the magnetic objective lens 308, the in-lens deflector systems 3071 to 3074, the retardation electrode 309 and the specimen 310, but an objective lens system according to this embodiment has a feature that it is comprised of a magnetic objective lens 508 which is formed by the magnetic pole piece circuit and the winding coil or just the winding coil (the lens also could be replaced by an electrostatic lens or a compound objective lens), a scanning deflection coil 507, and a moving stage 509 which can continuously move in X-Y directions, even in Z direction.

In the substrate inspection of operation, a large beam current released from an emitter 501 is produced through an immersion magnetic lens 503a and accelerated by the electrode 502. When it passes the objective lens 508 which can condense the beam, a scanning deflection coil 507 deflects it to probe the substrate on the continuously moving stage 509. Then the secondary electrons and backscattered electrons are released form the substrate and filtered by a first electron optical element 5051, and further, their dispersion which is generated by the first electron optical element 5051 is suppressed by a second electron optical element 5052 before the detector 506 received them, wherein the first and second electron optical elements, 5051 and 5052, are Wien filters.

In the defect review of operation, a small beam current is demanded and accordingly, the immersion magnetic lens 503a is turned off and the condenser lens 504a is switched on to generate it. The defect map according to the result of the substrate inspection is loaded into the host computer as a reference for the defect review to avoid scanning the whole substrate to improve time consuming. The first and second Wien filters, 5051 and 5052, provide with the same function for the signal electrons such as they do in the substrate inspection, but each of them works as at least a quadrupole field to deflect the signal electrons. In the end, the signal electrons from azimuths of the specimen are detected by the detector 506 to collect the stereo images of the defects. In addition, the first and second apertures can also be disposed below the lens 503*a* and 504*a* respectively and have the same function, as illustrated in FIG. 3(*a*).

Figure 5B:
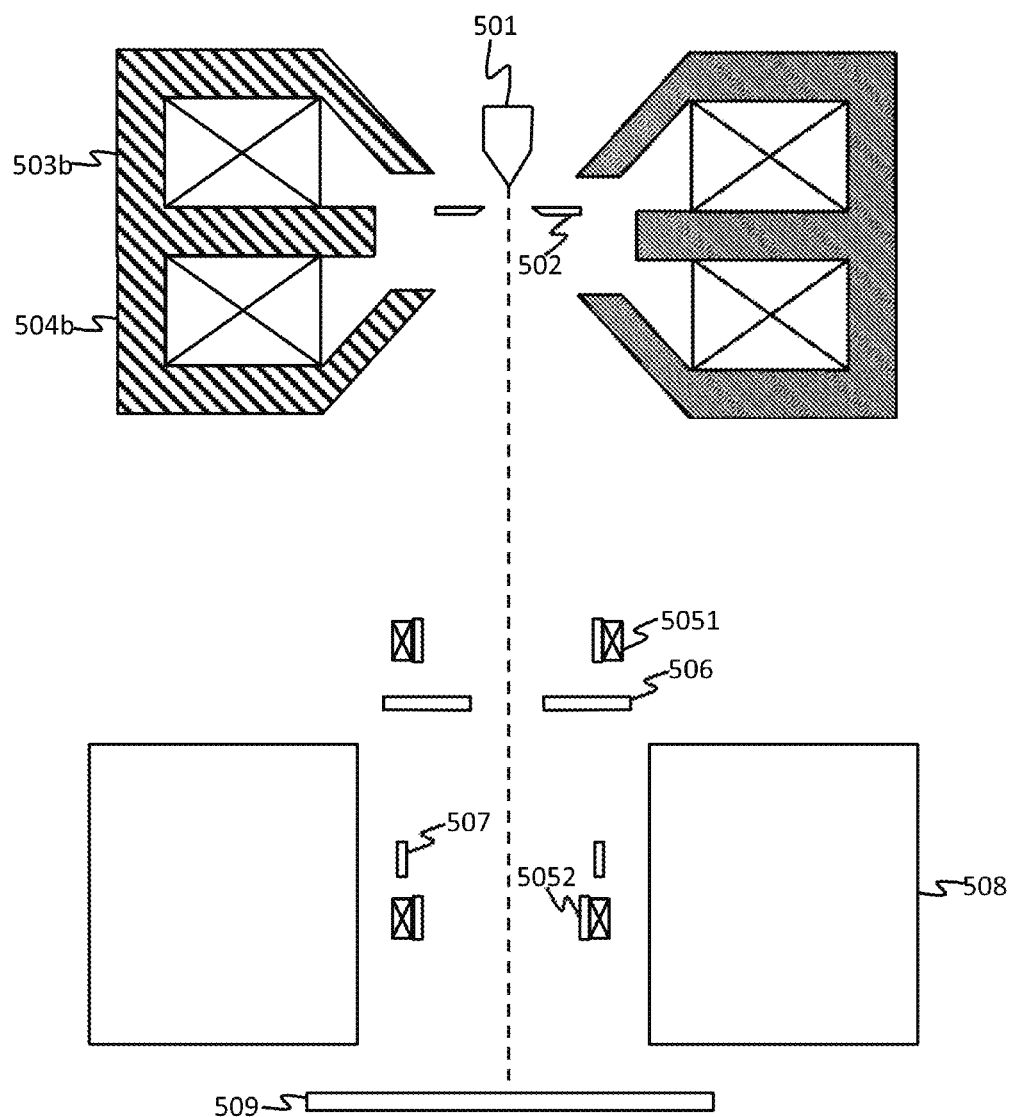

In one embodiment according to the second embodiment in FIG. 5(*a*), the immersion magnetic lens 503*a* and the condenser lens 504*a* are altered to a double lens 503*b* and 504*b* as shown in FIG. 5(*b*). The two working modes of inspection and review have the same operation with the embodiment shown in FIG. 3(*d*).

In another embodiments according to the second embodiment in FIGS. 5(*a*) and (*b*), a booster (not shown) can be added to each of them, which stretches from the cathode to the stage, to accelerate the beam current. The second Wien filter can be handled as that of the first embodiment.

The foregoing illustration and description of preferred embodiments are in accordance with the present invention and not limiting. The further modifications will be apparent to persons of ordinary skill in the art in light of the disclosure and are intended to fall within the spirit and scope of the appended claims.

What is claimed is:

1. A charged particle beam apparatus, comprising:
   a charged particle source for generating a beam current;
   an immersion condenser lens for an inspection mode of operation;
   a non-immersion condenser lens below the charged particle source for a review mode of operation;
   an objective lens for focusing the beam current onto a specimen;
   a first electron optical element in the objective lens to deflect signal charged particles emanated from the specimen;
   a second electron optical element to compensate aberrations generated when the signal charged particles pass through the first electron optical element; and
   a detector system with multi-channels for detecting the signal charged particles.

2. The charged particle beam apparatus of claim 1, wherein the immersion condenser lens is turned on in the inspection mode of operation and the immersion condenser lens is turned off in the review mode of operation.

3. The charged particle beam apparatus of claim 1 further comprising a first beam aperture for the inspection mode of operation is disposed closed to the charged particle source.

4. The charged particle beam apparatus of claim 1 further comprising a second beam aperture for the review mode of operation is disposed below the non-immersion condenser lens.

5. The charged particle beam apparatus of claim 1 further comprising a scanning deflection coil.

6. The charged particle beam apparatus of claim 1, wherein the first electron optical element with an electromagnetic multi-pole is below the detector system and makes a dipole field to select the signal charged particles for the inspection mode of operation and a quadrupole field to select the signal charged particles with different emission azimuth angles for the review mode of operation.

7. The charged particle beam apparatus of claim 1, wherein the second electron optical element with an electromagnetic multi-pole is above the detector system and makes a dipole or quadrupole field to compensate the aberrations.

8. The charged particle beam apparatus of claim 1, wherein the first and second electron optical elements are Wien filters or ExB filters.

9. An apparatus for inspection and/or review of a specimen, comprising:
   a charged particle source for generating a beam current;
   a magnetic immersion condenser lens;
   a magnetic non-immersion condenser lens;
   an objective lens system, comprising:
   a compound objective lens;
   a first deflection system for deflecting and positioning the beam current on the specimen;
   a second deflection system for deflecting the beam current to scan the specimen; and
   a detector with at least one channel to detect signal charged particles emanated from the specimen;
   wherein the inspection of the specimen is performed while the magnetic immersion condenser lens is turned on; and
   wherein the review of the specimen is performed while the magnetic immersion condenser lens and the first deflection system are turned off.

10. The apparatus for inspection and/or review of a specimen of claim 9 further comprising a first beam aperture for the inspection mode of operation is disposed closed to the charged particle source.

11. The apparatus for inspection and/or review of a specimen of claim 9 further comprising a second beam aperture for the review mode of operation is disposed below the non-immersion condenser lens.

12. The apparatus for inspection and/or review of a specimen of claim 9, wherein the compound objective lens, the first and second deflection systems form a swing objective retarding immersion lens.

13. The apparatus for inspection and/or review of a specimen of claim 9, wherein the first deflection system comprises a plurality of deflectors arranged within the compound objective lens and along an optical axis, and at least one of the deflectors is located in a retarding field of a retardation electrode for generating a swing objective lens axis.

14. The apparatus for inspection and/or review of a specimen of claim 9, wherein the second deflection system comprises a plurality of defectors arranged along the optical axis.

15. The apparatus for inspection and/or review of a specimen of claim 9 further comprising a first Wien filter is below the detector and makes a dipole field to select the signal charged particles for the inspection mode of operation and a quadrupole field to select the signal charged particles with different emission azimuth angles for the review mode of operation.

16. The apparatus for inspection and/or review of a specimen of claim 15 further comprising a second Wien filter is above the detector and makes a dipole or quadrupole field to compensate aberrations generated when the signal charged particles pass through the first Wien filter.

17. The apparatus for inspection and/or review of a specimen of claim 9, wherein the compound objective lens comprises an immersion magnetic lens and an electrostatic lens for focusing the beam current.

18. The apparatus for inspection and/or review of a specimen of claim 9, wherein the first deflection system has a large scanning deflective sensitivity for a large scanning field.

19. The apparatus for inspection and/or review of a specimen of claim 9, wherein the second deflection system has a small scanning deflective sensitivity for a small scanning field.

20. The apparatus for inspection and/or review of a specimen of claim 9, wherein the first deflection system is turned off and grounded for the review of the specimen and the second deflection system is turned off and grounded while the first deflection system is performing for the inspection of the specimen.

21. A method for inspection and review of a specimen, comprising:
- inspecting the specimen in an apparatus to position defect locations; and
- reviewing the defect locations;
- wherein the inspecting is performed in an inspection mode of operation while a magnetic immersion condenser lens is turned on; and
- wherein the reviewing is performed in a review mode of operation while a magnetic immersion condenser lens and a first deflection system are turned off.

* * * * *